United States Patent
Underwood et al.

(10) Patent No.: US 7,601,942 B2
(45) Date of Patent: Oct. 13, 2009

(54) OPTOELECTRONIC DEVICE HAVING AN ARRAY OF SMART PIXELS

(75) Inventors: Ian Underwood, Edinburgh (GB); James Gourlay, Edinburgh (GB)

(73) Assignee: Microemissive Displays Limited, Edinburgh (GB)

( * ) Notice: Subject to any disclaimer, the term of this patent is extended or adjusted under 35 U.S.C. 154(b) by 0 days.

(21) Appl. No.: 10/381,856

(22) PCT Filed: Oct. 10, 2001

(86) PCT No.: PCT/GB01/04505

§ 371 (c)(1), (2), (4) Date: Mar. 26, 2003

(87) PCT Pub. No.: WO02/31882

PCT Pub. Date: Apr. 18, 2002

(65) Prior Publication Data

US 2004/0012016 A1    Jan. 22, 2004

(30) Foreign Application Priority Data

Oct. 10, 2000  (GB) ................. 0024804.7

(51) Int. Cl.
*H01L 31/00* (2006.01)
(52) U.S. Cl. ..................... 250/214.1; 257/40
(58) Field of Classification Search ........... 250/214.1, 250/214 R; 257/40
See application file for complete search history.

(56) References Cited

U.S. PATENT DOCUMENTS

| | | | |
|---|---|---|---|
| 5,339,090 A * | 8/1994 | Crossland et al. ............ 345/90 |
| 5,644,418 A * | 7/1997 | Woodward .................. 398/209 |
| 5,736,754 A | 4/1998 | Shi et al. ..................... 257/89 |
| 5,777,318 A * | 7/1998 | Krishnamoorthy et al. .. 250/214 LS |
| 5,998,805 A | 12/1999 | Shi et al. ..................... 257/40 |
| 6,016,211 A * | 1/2000 | Szymanski et al. ............ 398/1 |
| 6,384,804 B1 * | 5/2002 | Dodabalapur et al. ........ 345/82 |
| 6,441,395 B1 * | 8/2002 | Yu et al. ...................... 257/40 |
| 2002/0027699 A1* | 3/2002 | Wilkinson et al. .......... 359/245 |
| 2004/0037949 A1 | 2/2004 | Wright ........................ 427/66 |

FOREIGN PATENT DOCUMENTS

| | | |
|---|---|---|
| EP | 0774787 A2 | 5/1997 |
| WO | WO 98/21755 | 5/1998 |
| WO | WO 00/60669 | 10/2000 |

OTHER PUBLICATIONS

Dodabalapur et al. "Organic Smart Pixels", Jul. 13, 1998, Applied Physics Letters, vol. 73, No. 2, pp. 142-144.*

Wu et al., "Design of a Novel a-Si Pin/OLED Image Sensor & Display Device", Society for Information Display (SID) 99 Digest, pp. 528-531, May 1999.

Ammermann et al., "A Novel Concept for Optical Interconnects Based on Organic Semiconductors and Heterostructures", CLEO/Europe, p. 33, Aug. 1994.

\* cited by examiner

*Primary Examiner*—Thanh X Luu
*Assistant Examiner*—Kevin Wyatt
(74) *Attorney, Agent, or Firm*—Howson & Howson LLP

(57) ABSTRACT

An optoelectronic device includes a substrate (6, 7) comprising semiconducting material and an array of smart pixels arranged on or in the substrate, each smart pixel comprising at least one layer (12) of organic light emitting material, and a light permeable electrode (13) in contact with the organic layer on a side thereof remote from the substrate. The smart pixels may be capable of one or more of a range of functions, including image sensing, processing, communication and display.

49 Claims, 3 Drawing Sheets

OPTOELECTRONIC DEVICE HAVING AN ARRAY OF SMART PIXELS

BACKGROUND TO THE INVENTION

The present invention relates to an optoelectronic device.

Organic light emitting diodes (OLEDs) comprise certain organic materials which are known to emit light under electrical stimulation. The materials can be either small molecules or polymer materials (in polymer light emitting diodes, PLEDs). These materials require different processes for practical manufacture into devices. Small molecule materials are deposited onto a substrate by vapour deposition whilst polymers are cast onto a substrate from a solution by spin-coating, printing, doctor blading or a reel-to-reel process. In a typical polymer LED, a polymer layer is deposited, by spin coating, onto indium tin oxide (ITO) coated glass. This is followed by heat treatment to drive off residual solvent and a reflective metal electrode is then evaporated onto the top surface of the polymer layer. The ITO, which is transparent, forms the other electrode and the polymer emits light through the ITO coated glass when a voltage is applied between the electrodes. Current and voltage control of the light emission is known.

Both types of materials and processes have been used to fabricate arrays on a number of different transparent and non-transparent surfaces. Methods known in the art for creating full colour displays include ink-jet printing of polymer solutions and vapour deposition of small molecule materials. Other known methods include the use of monochrome displays fitted with individual absorptive filters or colour changing media filters. Whilst both materials appear compatible with photo-resist technology, in practice the processing has reduced the efficiency and lifetime of the devices to unacceptable levels. High-resolution colour and monochrome displays have been demonstrated for small molecules by depositing them into microcavities. In EP-0,774,787, a full colour OLED array is fabricated on a CMOS substrate by this method. The drivers for the diode array are formed in the substrate.

Various types of liquid crystal display have been fabricated on crystalline silicon (LCOS) and other silicon materials such as polysilicon on glass. The silicon material provides the active matrix drive circuitry as well as the substrate. Similarly, a vacuum fluorescent display has been fabricated on crystalline silicon.

The manufacture of arrays of OLEDs on non-transparent substrates such as CMOS or bi-CMOS is hindered by the need to fabricate an (at least semi-) transparent electrode on top of the organic layers to allow light emission and viewing. Deposition of indium tin oxide directly onto the organic layers can cause unacceptable deterioration in the device performance. Another consideration is the need to carefully select the choice of metal electrode material directly in contact with the substrate so that it is fully compatible with microelectronic manufacturing equipment.

An electronic display is, in effect, a pixelated optoelectronic device in which electronic information is fed on to the display and converted to optical information on a pixel-by-pixel basis. A smart pixel array (SPA) is an array of optoelectronic pixels (also called cells or units) in which each pixel has the capability to communicate with other pixels in the same array or another array by electrical and/or optical means. The configuration of the communication (which cells communicated with which others by which means and in which direction) is usually dynamically programmable by means of optical or electrical signals fed to the SPA. Often communication within an array of pixels on the same substrate is done by electronic means while communication between pixels in separate arrays or on separate or remote substrates is done by optical means.

SPAs have been implemented in the past in technologies such as, for example, liquid crystal over crystalline silicon, monolithic III/V semiconductor, and III/V semiconductor bonded to CMOS silicon by flip-chip technology.

SPAs have been used in fields as diverse as, for example, image processing, telecommunications switching and optoelectronic neural networks.

The optical communication between SPAs is often carried out using light or electromagnetic radiation of wavelengths other rather than visible. For example, SPAs used in telecommunications systems often use infra-red wavelengths.

SUMMARY OF THE INVENTION

According to the present invention there is provided an optoelectronic device including a substrate comprising semiconducting material and an array of smart pixels arranged on or in the substrate, each smart pixel comprising at least one layer of organic light emitting material, and an (at least semi-) transparent electrode in contact with the organic layer on a side thereof remote from the substrate.

Preferably, and in particular where the device forms a display, the electrode comprises an electrically conducting polymer, and preferably, the surface of the substrate is polished or smoothed to produce a flat surface.

The substrate may consist of amorphous, polycrystalline or monocrystalline silicon. Alternatively, the substrate may comprise a layer of amorphous, polycrystalline or monocrystalline silicon overlying a layer of glass or sapphire. Preferably, the polishing or smoothing of the substrate is effected prior to the deposition of the electrode, or organic, materials of each OLED smart pixel. The smart pixels of the array may be different, similar or identical, or the array may comprise any two or all three of different, similar and identical smart pixels. Pixels in the array which are physically similar or identical may be programmed once and for all or dynamically to perform the same or different functions.

The smart pixels are preferably of the same size and may be arranged as squares or rectangles on a Cartesian grid. For example, see the two-by-two pixel corner sections of a pair of adjacent smart pixel arrays illustrated in FIG. 6. Other grids, such as hexagonal pixels on a hexagonal grid or ring, and wedge shaped pixels on a polar or radial grid, are also feasible as embodiments of the invention.

Each smart pixel of the array is capable of carrying out one, some or all of the following tasks:

Process information electronically within the pixel

Store information within the pixel

Transmit electrical signals to one or more other pixels in the same array by means of conducting layers which form part of an active circuit (see, for instance, conducting layer "A" in FIG. 6) or to one or more pixels in one or more other arrays by a means conventionally used in electric or optical chip to chip interconnect (such as copper tracks on a PCB, wires in a ribbon cable or optical fibres) (see, for instance, interconnect "B" in FIG. 6)

Receive electrical signals from one or more other pixels in the same array by means of conducting layers which form part of an active circuit (see, for instance, conducting layer "A" in FIG. 6) or to one or more pixels in one or more other arrays by a means conventionally used in electric or optical chip to chip interconnect (such as copper tracks on a PCB, wires in a ribbon cable or optical fibres) (see, for instance, interconnect "B" in FIG. 6)

Transmit optical signals to one or more other pixels in the same array or another array by means of light waves propagating in free space or through an optical system (see, for instance, means "C" and "D" in FIG. 6)

In the case of organic light emitters, such as LEDs, microcavity LEDs, laser diodes or organic modulators utilising absorption shifting mechanisms, convert electrical signals into optical signals, for off-chip communication Receive optical signals from one or more other pixels in the same array or another array by means of light waves propagating in free space or through an optical system (see, for instance, means "C" and "D" in FIG. 6)

The above processes may be carried out singly, or some or all together at the same time, or in sequence, one after the other or in any other combination.

Optical signals received by a pixel may be arranged to be converted into electrical signals by conversion means, for example, one of the following:

One or more PN junction diodes or PIN diodes or phototransistors or photoconductors or one or more other photosensitive elements or some combination of these, within the active substrate, (each) electrically connected to suitable amplification circuits within the active circuit.

One or more organic photodiodes or phototransistors or other photosensitive elements formed in a layer above the active circuit and (each) electrically connected to the input of a suitable amplification circuit within the active circuit.

Some combination of the above semiconductor photosensitive and organic photosensitive structures each of which is electrically connected to the input of a suitable amplification circuit within the active circuit.

Electrical signals within the pixel are preferably arranged to be converted into optical signals by means of one or more driver circuits, within the active circuit, (each of) whose output is connected to the underside of an arrangement of one or more organic light emitting diodes in series or parallel or both, formed in a layer above the active circuit. The top side of the organic light emitting diode or diodes is preferably connected to an electrode which is common to some or all of the organic light emitting diodes in the smart pixel array. This common electrode is preferably of metal and in contact with the substrate. Depending on the relative work functions of the metal and transparent electrodes, either may serve as the anode with the other constituting the cathode.

In one embodiment, the smart pixels are configured to form an optoelectronic communication link on- and off-chip, for microsystem integration, computer interconnect, datacom or telecom applications. For example, the smart pixels can enable chip-to-chip communication to relieve data bottlenecks, enable optical clock distribution to synchronise systems or allow direct chip access to optical disks or optical memories where conversion to/from electrical signals is performed at the smart pixel.

The pixel configuration may be capable of providing data buffering and multiplexing and demultiplexing functions and handling data protocols. Organic photodiodes or phototransistors may convert optical signals into electrical signals for on-chip communication. Parallel communication links can be provided by spatial, temporal or wavelength multiplexing. Wavelength multiplexing can be provided by different pixels preferentially emitting and/or absorbing different colours of light. For example, microcavity structures, possibly in conjunction with doping of rare-earth metals, can be employed to give narrow-band sources at selected wavelengths. The doping, microstructuring, or voltage applied can be selected to varying the wavelength from pixel to pixel as required. Also, organic emitting devices, in conjunction with narrow band photoluminescent, colour conversion structures can be employed.

The optoelectronic communication links can be point-to-point, multi-cast or broadcast. The links can be static (fixed) or dynamic (reconfigurable). Optical fibres, optical waveguides or free-space microoptics/optics can be used to transfer the light from source to destination. The organic optoelectronic devices can be micro-structured to ease optical coupling. Passive or active optical waveguide structures in organic or inorganic materials can be integrated with the smart pixels on the same substrate.

In one embodiment, the smart pixels are configured as an image sensor and/or display. Broadband or narrowband light in the range of wavelengths from the ultraviolet to infrared, incident upon the smart pixels can be converted to a digital representation and stored at the pixels. Localised image-processing operations, such as image enhancement, equalisation or data encryption can be performed. The data can then be output optically in the form of a displayed image, or transported elsewhere as optical or electrical communication signals. For example, infra red images can be converted for display in visible colours.

In one embodiment, the smart pixels are configured as an image sensor and/or printer. The optical signals can be used to transfer images from storage on the pixel array to a light sensitive film.

The organic light emitting material is preferably a polymer but may alternatively be a monomer or a transition metal chelate. Apart from the light emitting material, organic layers in the pixel elements may include an electron transport material layer, a hole transport material layer, a protective cap material layer and a conducting polymer material layer.

As well as a conducting polymer, the (at least semi-) transparent electrode may comprise further layers, e.g. of indium tin oxide (ITO) or other transparent or semi-transparent metal oxides or low or high work function metals, or conducting epoxy resin, deposited onto the organic layer furthest from the substrate. Alternatively, a glass or plastic sheet, coated with ITO, conducting polymer, or at least one of the layers that constitute the (at least semi-) transparent electrode, may be bonded to said furthest layer or another layer of this electrode, to complete the electrode and serve as a barrier to the ingress of oxygen and water. The surface of the device may be completed by encapsulation with a further layer of polymer or glass.

The preferred conducting polymer is poly(ethlyendioxythiophene), sold by Bayer AG under the trade mark PEDOT. Other molecularly altered poly(thiophenes) are also conducting and could be used, as could the emaraldine salt form of polyaniline. To improve the adherence of PEDOT to certain smooth substrates a polymer blend with a non-conducting polymer, preferably poly (vinyl alcohol) (PVA), can be made. For example, a 9 wt % solution of PVA with PEDOT in a 10(PVA):6 volume ratio can be used. A wide range of molecular weights of PVA can be used without much difference in the resultant film or its conductivity.

In still another embodiment, a metal electrode may consist of a plurality of metal layers, for example a higher work function metal such as aluminium deposited on the substrate and a lower work function metal such as calcium deposited on the higher work function metal. In another example, a further layer of conducting polymer lies on top of a stable metal such as aluminium. Preferably, the electrode also acts as a mirror behind each pixel and is either deposited on, or sunk into, the planarised surface of the substrate. However, there may alternatively be a light absorbing black layer or reflective structure between each pixel.

High work function metals that could be used include tungsten, nickel, cobalt, platinum, palladium and their alloys, and possibly niobium, selenium, gold, chromium, tantalum, hafnium, technetium and their alloys.

The substrate may also provide data drivers, data converters and scan drivers for processing information to address the array of pixels so as to create images.

In a method of making the optoelectronic device according to the invention, the organic devices can be integrated directly onto the semiconductor circuit substrate, formed by vacuum deposition, printing, stencilling or spin coating methods, or formed separately and hybridised, using flip-chip or wafer bonding methods. These processes could be low-temperature (<100° C.) and allow full hermetic encapsulation, to maximise device life-time and performance.

In still another embodiment of the method, selective regions of a bottom conducting polymer layer are made non-conducting by exposure to a suitable aqueous solution allowing formation of arrays of conducting pixel pads which serve as the bottom contacts of the pixel electrodes.

BRIEF DESCRIPTION OF THE DRAWINGS

In order that the present invention may be more readily understood, reference will now be made, by way of example only, to the accompanying drawings, in which:—

DETAILED DESCRIPTION OF THE PREFERRED EMBODIMENTS

Figure 1:
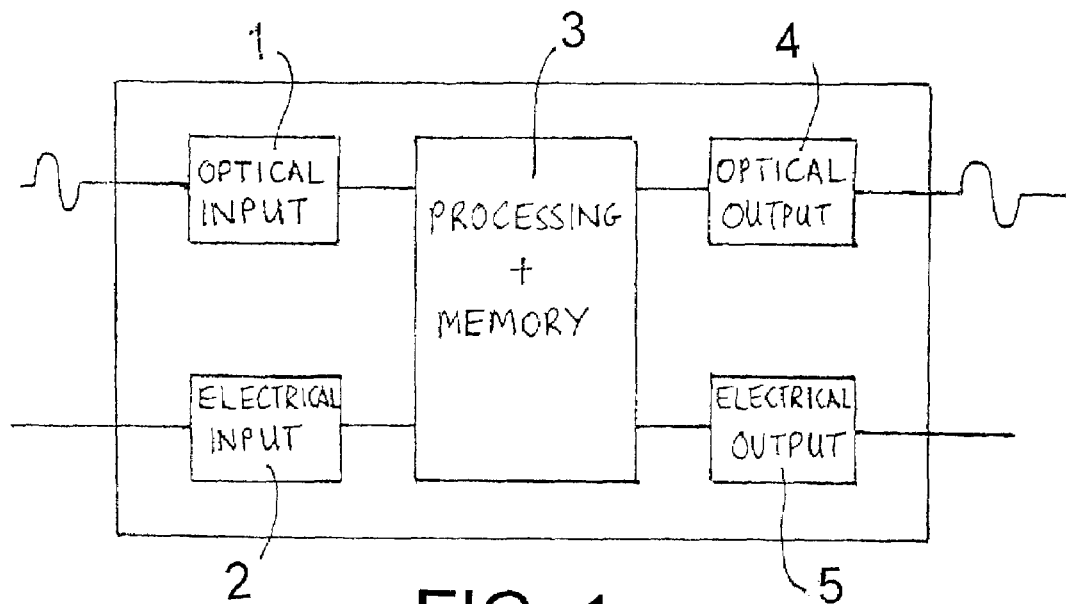
FIG. 1 is a schematic diagram of a smart pixel which can be implemented using the invention.

FIG. 1 shows a smart pixel which is capable of receiving optical signals at an optical Rx 1 and electrical signals at an electrical Rx 2. The received signals are processed in a processor 3 where data can optionally be stored. Optical signals are transmitted from an optical Tx 4 and electrical signals are transmitted from an electrical Tx 5.

Figure 2:
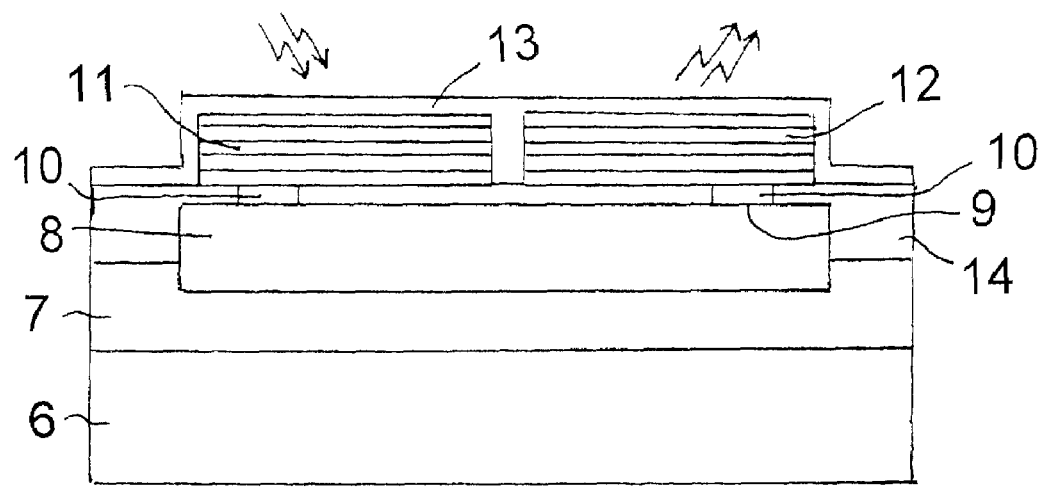
FIG. 2 is a schematic cross section of a smart pixel according to an embodiment of the invention.

Each smart pixel in the array of the invention may be as exemplified in FIG. 2. The pixel comprises, from bottom to top, the following elements: a passive substrate 6, an active substrate 7, active electronic devices 8, circuit electrical interconnections 9, pad connections 10 to organic conducting and light emitting/detecting layers, two unspecified series 11, 12 of conducting, organic conducting, hole transport, electron transport and organic light emitting or detecting layers, and a transparent conducting layer 13 forming a transparent electrode. One of the series 11 includes at least one light detecting layer whilst the other series 12 includes at least one light emitting layer. A planarising dielectric 14 may cover the active substrate 7.

Once the active matrix circuitry has been fabricated in the semiconductor substrate, for example using CMOS technology, the surface of the substrate can be planarised. This planarisation either takes place as part of the manufacturing process of the integrated circuit or as a subsequent customising step.

Figure 3:
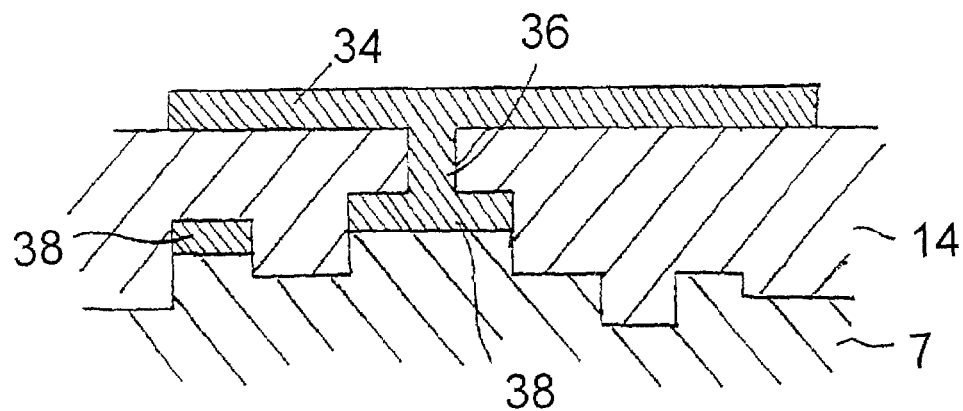
FIG. 3 is a schematic cross section of a single pixel of a planarised substrate according to an embodiment of the invention (not showing the polymer LED)

As shown in FIG. 3, the planarisation is effected by depositing the dielectric 14, for example a polymeric material, on the surface of the active substrate 7. A conducting polymer that can be patterned to create areas of insulation can be used instead for this purpose. A metal mirror/electrode 34, which may be of aluminium, for connecting one of the series of layers 11 to the appropriate point in the circuit, is then deposited, the connection to the circuit being established by a metallic conducting via 36. Metallised portions of the CMOS circuit are designated 38.

Figure 4:
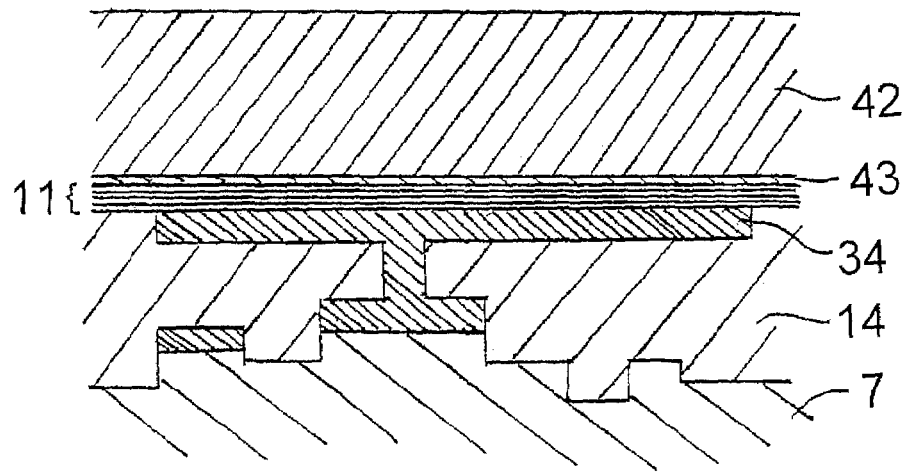
FIG. 4 is a schematic cross section of an alternative substrate, showing the deposited polymer LED.

FIG. 4 shows an alternative arrangement in which the electrode/mirror 34 is sunk into the dielectric surface, i.e. full planarisation is achieved.

FIG. 4 also shows one way in which the device construction can be completed. The series of layers 11 is deposited and the display is sealed by coating with a glass plate 42 coated on its inner surface with a transparent conducting layer 43 which comprises the conducting polymer and, optionally, ITO.

Figure 5:
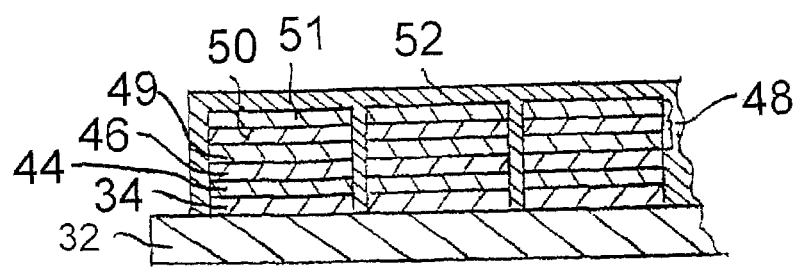
FIG. 5 is a schematic, fragmentary side view of an array of polymer LEDs.
Figure 6:
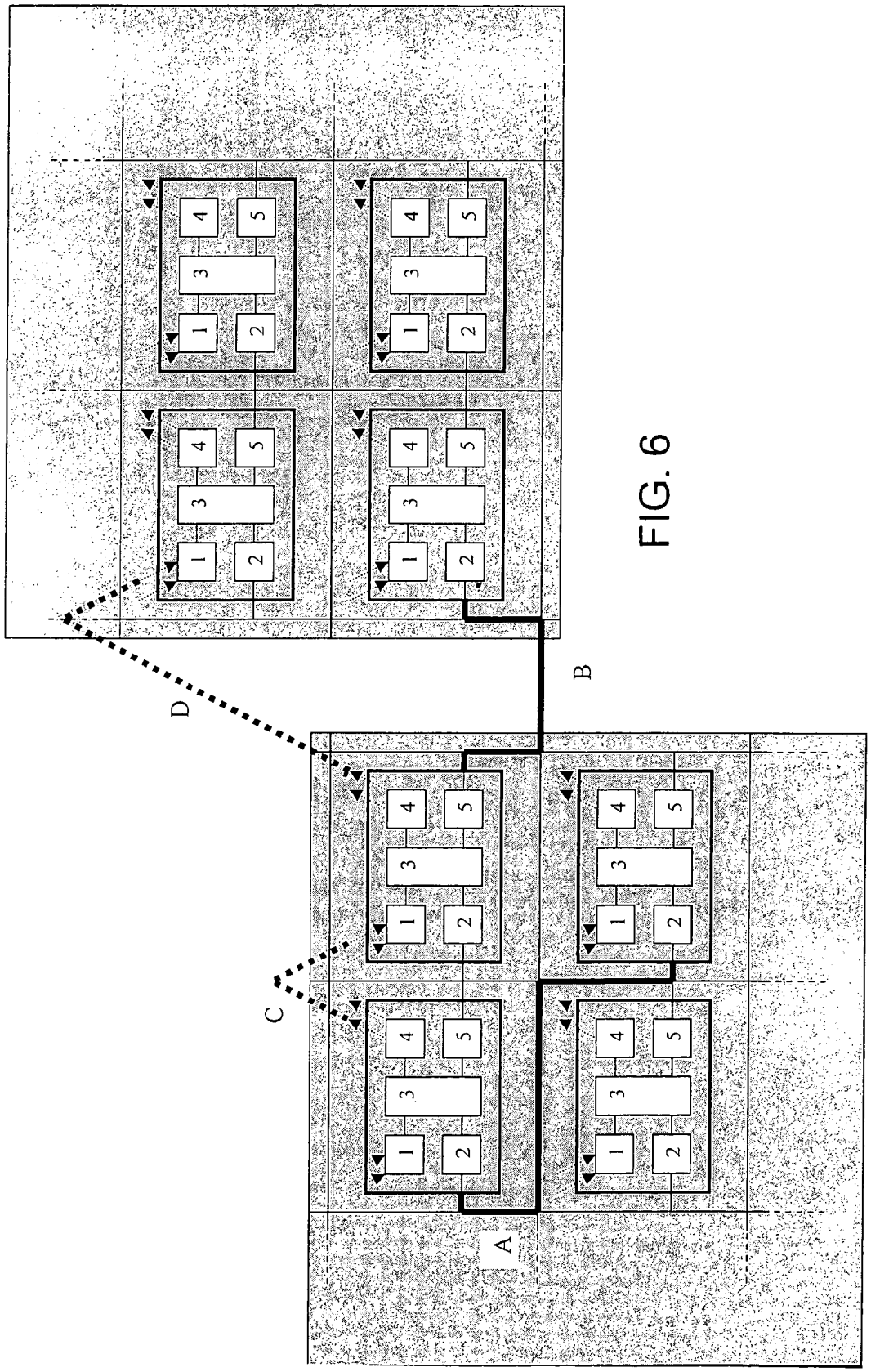
FIG. 6 is a schematic view of adjacent corners of a pair of smart pixel arrays according to the present invention.

FIG. 5 shows an alternative device construction including a particular example of the series of deposited layers. For simplicity, FIG. 5 shows ordinary pixels instead of smart pixels, but the example is equally applicable to forming smart pixels according to the invention. On the substrate 32 there are deposited, in turn, the planarised aluminium electrode/mirror 34, optionally an electron or hole transport layer 44, a light emitting polymer 46, and a transparent electrode 48. The transparent electrode may for example consist of a thin layer of high work function metal 49, of a thickness to be adequately transparent, a layer of conducting polymer 50 and a layer of ITO 51. An encapsulation layer/barrier 52 which seals all of the LEDs of the array, including their sides, completes this example of the display construction, three pixels of which are shown in FIG. 5.

In manufacturing the display shown in FIG. 5, the flat metal mirrors 34 are applied to the surface of the substrate 32 (preferably a CMOS or bi-CMOS backplane) so as to cover most of the area of each pixel with minimal gaps between the mirrors. Chemical Mechanical Polishing may be used to enhance the global and local planarisation.

The layers of polymer and related materials can be deposited by an automated technique using equipment currently used for applying photo-resists used for the patterning of integrated circuit layers. This gives precise control and a uniform thickness for each layer. Alternatively, the polymer layers could be ink-jet printed. Rare earth chelates can be vacuum deposited.

The encapsulation layer 52 is applied after making the connections to the transparent electrode in each pixel. Encapsulation, and possibly the assembly of the pixel, are carried out in clean, dry conditions under a partial vacuum, or a suitable inert or controlled atmosphere.

The display of the invention is robust, the organic LEDs being well protected, but has simplified manufacture and encapsulation. The power generated as heat should be manageable but could be decreased by reducing the current or voltage used to drive each element. If current routing problems arise, multiple power supply bond pads can be used on the silicon chip.

INDUSTRIAL APPLICABILITY

Devices according to the present invention can be used to implement any of the following:
Optoelectronic displays
Optoelectronic computing systems, including neural networks and digital parallel networks
Optoelectronic interfaces between the electrical/electronic domain and the optical domain in datacoms/telecoms, optical backplanes and chip-to-chip (inter and intra) interconnect
Optoelectronic cross-connects, switches, buffers, add/drop multiplexers, for datacoms/telecoms, optical backplanes and computing interconnects
Smart sensors and/or printers for digital photography, photolithography and material processing
Smart sensors and/or displays, with integrated functions such as pattern recognition, compressed data, image enhancement, smart resolution, smart gain, smart colour conversion.

All forms of the verb "to comprise" in this specification mean "to consist of or include".

The invention claimed is:

1. An optoelectronic device comprising, in order: a substrate (7) providing active circuitry (8), circuit electrical interconnections (9), and pad connections (10); the optoelectronic device further comprising: a first series (11) of conducting, organic conducting, hole transport, electron transport and organic light emitting layers on one of said pad connections (10), a second series (12) of conducting, organic conducting, hole transport, electron transport and light detecting layers on another one of said pad connections (10), and a transparent conductive layer (13) forming a transparent electrode, so as to provide an array of smart pixels, each smart pixel comprising part of said active circuitry.

2. A device according to claim 1, wherein the substrate comprises a semiconducting layer.

3. A device according to claim 2, wherein the substrate comprises a layer of silicon.

4. A device according to claim 3, wherein said layer of silicon overlies a layer of insulating material.

5. A device according to claim 1, wherein said transparent electrode comprises a conducting polymer.

6. A device according to claim 5, wherein the conducting polymer is a molecularly altered poly(thiophene).

7. A device according to claim 6, wherein the conducting polymer is poly(ethlyendioxythiophene).

8. A device according to claim 7, wherein the poly(ethlyendioxythiophene) is blended with poly (vinyl alcohol).

9. A device according to claim 1, wherein a surface of said substrate is flat.

10. A device according to claim 1, wherein said array includes smart pixels that process information electronically within the pixel.

11. A device according to claim 1, wherein said array includes smart pixels that store information within the pixel.

12. A device according to claim 1, further comprising an electrical means via which said smart pixels of said array transmit and/or receive information to or from one or more other pixels.

13. A device according to claim 12, wherein said one or more other pixels are in another array.

14. A device according to claim 1, further comprising an optical means via which said smart pixels of said array transmit and/or receive information to one or more other pixels.

15. A device according to claim 14, wherein said one or more other pixels are in another array.

16. A device according to claim 1, wherein said array includes smart pixels that convert electrical signals into optical signals.

17. A device according to claim 16, wherein said smart pixels that convert electrical signals into optical signals are connected to an arrangement of organic light emitting diodes formed in a layer over the substrate.

18. A device according to claim 16, wherein said smart pixels that convert electrical signals into optical signals are connected to an arrangement of organic light modulators or amplifiers formed in a layer over the substrate.

19. A device according to claim 1, wherein said array includes smart pixels that modify or amplify light under control of electrical signals.

20. A device according to claim 1, wherein at least one of said active circuit parts of said smart pixels provides a function selected from the group consisting of data buffering, multiplexing, demultiplexing, and handling data protocols.

21. A device according to claim 1, further comprising parallel communication links that are provided by one of spatial, temporal and wavelength multiplexing.

22. A device according to claim 21, wherein different of said pixels emit and/or absorb different colors of light so as to provide wavelength multiplexing.

23. A device according to claim 22, comprising microcavity pixel structures providing narrowband sources at selected wavelengths.

24. A device according to claim 23, wherein said structures are doped differently to vary the wavelength from pixel to pixel.

25. A device according to claim 24, comprising narrowband photoluminescent colour conversion pixel structures.

26. A device according to claim 1, further comprising point-to-point optoelectronic communication links.

27. A device according to claim 26, wherein said optoelectronic communication links are reconfigurable.

28. A device according to claim 26, further comprising waveguide structures integrated with said smart pixels on said substrate.

29. A device according to claim 1, wherein said smart pixels are configured as an intelligent image sensor.

30. A device according to claim 29, wherein said smart pixels convert light incident thereon to a digital representation and store said representation.

31. A device according to claim 1, wherein said smart pixels perform localized image processing operations including at least one of image enhancement, equalization and data encryption.

32. A device according to claim 1, wherein said smart pixels are configured as an intelligent image display.

33. A device according to claim 1, wherein said organic light emitting and light detecting layers are made of a polymer.

34. A device according to claim 1, wherein said smart pixels include at least one further layer selected from a group consisting of a protective cap material layer, and a conducting polymer material layer.

35. A device according to claim 1, wherein said transparent electrode includes a further layer on said organic layer of said pixel that is furthest from said substrate, said further layer selected from a group consisting of an indium tin oxide layer, another light permeable metal layer, another light permeable metal oxide layer, and a conducting epoxy resin layer.

36. A device according to claim 1, further comprising at least one organic encapsulation layer on a surface of said device.

37. A device according to claim 1, further comprising an electrode deposited on said substrate, said electrode being formed from a higher work function, light permeable, conducting material selected from a group consisting of aluminum, tungsten, nickel, cobalt, platinum, palladium, niobium, selenium, gold, chromium, tantalum, hafnium, technetium and their alloys, and indium tin oxide.

38. A device according to claim 37, wherein said electrode is arranged to act as a mirror behind each pixel.

39. A device according to claim 1, further comprising a stable metal electrode having a layer of conducting polymer overlying said stable metal electrode.

40. A device according to claim 39, wherein said electrode is arranged to act as a mirror behind each pixel.

41. A device according to claim 1, wherein said array of smart pixels has conversion means for converting optical signals into electrical signals.

42. A device according to claim 41, wherein said conversion means includes at least one of a PN junction diode, a PIN diode, a phototransistor and a photoconductor.

43. A device according to claim 41, wherein said conversion means is in said active circuitry.

44. A device according to claim 41, wherein said conversion means includes at least one organic layer formed over said substrate.

45. A device according to claim 1, further comprising multi-cast optoelectronic communication links.

46. A device according to claim 1, further comprising broadcast optoelectronic communication links.

47. A device according to claim 1, wherein said organic light emitting and light detecting layers are made of a monomer.

48. A device according to claim 1, wherein said organic light emitting and light detecting layers are made of a transition metal chelate.

49. A device according to claim 1, wherein said substrate includes circuitry for processing information to address said array of smart pixels so as to create images.

* * * * *

UNITED STATES PATENT AND TRADEMARK OFFICE
CERTIFICATE OF CORRECTION

PATENT NO. : 7,601,942 B2  Page 1 of 1
APPLICATION NO. : 10/381856
DATED : October 13, 2009
INVENTOR(S) : Underwood et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 138 days.

Signed and Sealed this

Fifth Day of October, 2010

David J. Kappos
*Director of the United States Patent and Trademark Office*